United States Patent
Dai et al.

(10) Patent No.: US 9,698,018 B1
(45) Date of Patent: Jul. 4, 2017

(54) INTRODUCING SELF-ALIGNED DOPANTS IN SEMICONDUCTOR FINS

(71) Applicant: GLOBALFOUNDRIES Inc., Grand Cayman (KY)

(72) Inventors: Xintuo Dai, Rexford, NY (US); Haigou Huang, Rexford, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/132,589

(22) Filed: Apr. 19, 2016

(51) Int. Cl.
| | | |
|---|---|---|
| H01L 21/225 | (2006.01) | |
| H01L 29/66 | (2006.01) | |
| H01L 21/8238 | (2006.01) | |
| H01L 27/088 | (2006.01) | |
| H01L 21/02 | (2006.01) | |
| H01L 27/092 | (2006.01) | |

(52) U.S. Cl.
CPC ........ *H01L 21/2255* (2013.01); *H01L 21/022* (2013.01); *H01L 21/02129* (2013.01); *H01L 21/823821* (2013.01); *H01L 27/0886* (2013.01); *H01L 27/0924* (2013.01); *H01L 29/66795* (2013.01)

(58) Field of Classification Search
CPC .......... H01L 29/66795; H01L 21/2255; H01L 21/823821; H01L 21/02129; H01L 21/823431; H01L 27/0924; H01L 27/0886
See application file for complete search history.

(56) References Cited

U.S. PATENT DOCUMENTS

| | | | | |
|---|---|---|---|---|
| 2015/0179503 A1* | 6/2015 | Tsai | ................... | H01L 21/76224 257/347 |
| 2015/0243739 A1* | 8/2015 | Chen | ................... | H01L 29/7851 257/623 |
| 2015/0372144 A1* | 12/2015 | Fang | ................... | H01L 29/7851 257/192 |

(Continued)

OTHER PUBLICATIONS

Brand et al., "Intel's 0.25 Micron, 2.0 Volts Logic Process Technology", Intel Technology Journal Q3'98, 1998, retrieved on Apr. 18, 2016 from http://mprc.pku.edu.cn/~liuxianhua/chn/corpus/Notes/articles/itj/source/1998q3_01p856.pdf, 9 Pages.

(Continued)

*Primary Examiner* — Daniel Luke
(74) *Attorney, Agent, or Firm* — Ditthavong & Steiner, P.C.

(57) ABSTRACT

A method of introducing self-aligned dopants in semiconductor fins and the resulting device are provided. Embodiments include providing semiconductor fins on first and second portions of a substrate; forming a BSG layer on side surfaces of the semiconductor fins on the first portion of the substrate; forming a first SiN layer on the BSG layer; forming a high quality oxide layer over an upper surface of the substrate, the first SiN layer and side surfaces of the semiconductor fins on the second portion of the substrate; forming a PSG layer over the high quality oxide layer on the second portion of the substrate and side surfaces of the semiconductor fins on the second portion of the substrate; and forming a second SiN layer over the high quality oxide layer and the PSG layer.

20 Claims, 10 Drawing Sheets

(56) References Cited

U.S. PATENT DOCUMENTS

2016/0056156 A1* 2/2016 Ghani ............ H01L 21/823821
257/401
2017/0062280 A1* 3/2017 Li .................. H01L 21/823821

OTHER PUBLICATIONS

Seshan, "The Quality and Reliability of Intel's Quarter Micron Process", Intel Technology Journal Q3'98, 1998, retrieved on Apr. 18, 2016 from http://citeseerx.ist.psu.edu/viewdoc/download;sessionid=4D74EF1066652ED5CE90AE7EB703CC63?doi=10.1.1.14.7384&rep=rep1&type=pdf, 11 Pages.
Thompson et al., "MOS Scaling: Transistor Challenges for the 21st Century", Intel Technology Journal Q3'98, 1998, retrieved on Apr. 18, 2016 from http://neo.dmcs.p.lodz.pl/micro/tho98.pdf, 19 Pages.
Bjorkholm, "EUV Lithography—The Successor to Optical Lithography?", Intel Technology Journal Q3'98, 1998, retrieved on Apr. 18, 2016 from http://citeseerx.ist.psu.edu/viewdoc/download-?doi=10.1.1.13.9908&rep=rep1&type=pdf, 8 Pages.

* cited by examiner

INTRODUCING SELF-ALIGNED DOPANTS IN SEMICONDUCTOR FINS

TECHNICAL FIELD

The present disclosure relates to a method for fabricating a semiconductor device having doped fins. The present disclosure is particularly applicable to the fabrication of a semiconductor device using borosilicate glass (BSG) and phospho silicate glass (PSG) over the semiconductor fins, particularly for the 10 nanometer (nm) technology node and beyond.

BACKGROUND

Fin type field effect transistors (finFETs) are popular because of the increased miniaturization that they enable over other semiconductor devices. During the fabrication of finFETs semiconductor material that forms the fins may be subjected to the introduction of dopants, for example, boron and phosphorus. Conventional doping may result in interaction between the dopants, causing weak points and unwanted doping. Another method of introducing the dopants into the fins is through BSG and PSG layers. The BSG layer is formed on the p-type finFETs (p-FETS), a PSG is formed over both the p-FETs and the n-type finFETs (n-FETs), and then the PSG layer is removed, e.g. by etching, from the p-FETs. However, the etching tends to damage the BSG layer. Further, when the dopants are driven into the fins, some dopants go into the shallow trench isolation (STI) regions between the fins.

A need therefore exists for methodology enabling introduction of boron and phosphorus into semiconductor fins in a self-aligned manner with no dopants in the STI regions and the resulting device.

SUMMARY

An aspect of the present disclosure is a method for introducing self-aligned dopants in semiconductor fins.

Another aspect of the present disclosure is a device having self-aligned dopants in semiconductor fins.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing semiconductor fins on first and second portions of a substrate; forming a BSG layer on side surfaces of the semiconductor fins on the first portion of the substrate; forming a first silicon nitride (SiN) layer on the BSG layer; forming a high quality oxide layer over an upper surface of the substrate, the first SiN layer and side surfaces of the semiconductor fins on the second portion of the substrate; forming a PSG layer over the high quality oxide layer on the second portion of the substrate and side surfaces of the semiconductor fins on the second portion of the substrate; and forming a second SiN layer over the high quality oxide layer and the PSG layer.

Another aspect of the present disclosure include forming the BSG layer and the first SiN layer by: depositing a BSG material over the substrate and the semiconductor fins; depositing a SiN material over the BSG material; forming a mask over the SiN material over the first portion of the substrate and the semiconductor fins on the first portion of the substrate; removing the SiN material and the BSG material from the second portion of the substrate and from the semiconductor fins on the second portion of the substrate; and removing the mask.

Further aspects include a method for forming the mask by: depositing a spin-on-hardmask (SOH) material over the SiN material; forming a hard mask on an upper surface of the SOH material; forming a photoresist on the hard mask over the first portion of the substrate; removing the hard mask, and the SOH material over the second portion of the substrate; and removing the photoresist. Other aspects include removing the SiN and the BSG materials from the second portion of the substrate and the semiconductor fins on the second portion of the substrate by etching to form the BSG layer and the first SiN layer. Further aspects include etching the SiN layer and the BSG layer from an upper surface of the first portion of the substrate subsequent to removing the mask. Additional aspects include etching the SiN layer and the BSG layer on a bottom portion of the semiconductor fins to form an acute angle with the surface of the first portion of the substrate.

Another aspect includes a method for forming the high quality oxide layer by: depositing a high quality oxide material over the substrate, the first SiN layer and the semiconductor fins on the second portion of the substrate.

A further aspect includes a method for forming the PSG layer by: depositing a PSG material over the high quality oxide layer; forming a mask with an opening over the first portion of the substrate; removing the PSG material from the first portion of the substrate and from the semiconductor fins on the first portion of the substrate; and removing the mask.

Other aspects include a method for forming the mask by: forming a SOH material and a hard mask over the PSG material over the second portion of the substrate and the semiconductor fins on the second portion of the substrate. A further aspect includes removing the PSG material by: etching selective to the high quality oxide layer.

A further aspect of the present disclosure is a device including: semiconductor fins on first and second portions of a substrate; a BSG layer on side surfaces of the semiconductor fins on the first portion of the substrate; a first SiN layer on the BSG layer; a high quality oxide layer over an upper surface of the substrate, the first SiN layer and side surfaces of the semiconductor fins on the second portion of the substrate; a phospho silicate glass (PSG) layer over the high quality oxide layer on the second portion of the substrate and side surfaces of the semiconductor fins on the second portion of the substrate; and a second SiN layer over the high quality oxide layer and the PSG layer.

Aspects of the device include the BSG layer having a thickness of 2 nanometer (nm) to 5 nm. Other aspects include the first SiN layer having a thickness of 2 nm to 5 nm. A further aspect includes the high quality oxide layer having a thickness of 1 nm to 5 nm. Another aspect includes the PSG layer having a thickness of 2 nm to 5 nm. A further aspect includes the second SiN layer having a thickness of 1 nm to 5 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of a damaged BSG layer, interaction between dopants, and dopants entering the STI regions attendant upon doping finFET fins. In accordance with embodiments of the present disclosure, dopants are introduced in a self-aligned way and a SiN capping layer is utilized to drive the dopants into the fins but not into STI regions. Further, there is no interaction between boron and phosphorus doped films, thereby avoiding weak points and unwanted doping.

Methodology in accordance with embodiments of the present disclosure includes providing semiconductor fins on first and second portions of a substrate and forming a BSG layer on side surfaces of the semiconductor fins on the first portion of the substrate. A first SiN layer is then formed on the BSG layer, and a high quality oxide layer is formed over an upper surface of the substrate, the first SiN layer and side surfaces of the semiconductor fins on the second portion of the substrate. Next, a PSG layer is formed over the high quality oxide layer on the second portion of the substrate and side surfaces of the semiconductor fins on the second portion of the substrate. Then, a second SiN layer is formed over the high quality oxide layer and the PSG layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1J schematically illustrates sequential steps of a method for forming a BSG layer and a PSG layer over a silicon substrate with semiconductor fins using SiN as a capping layer, in accordance with an exemplary embodiment. Adverting to FIG. 1A, the substrate 101, formed of silicon (Si), serves as a foundation for forming silicon fins. For example, reactive ion etching (RIE) may be performed to etch the Si. Subsequently, STI material may be deposited in the open area and recessed to reveal the semiconductor fins 103, 105, 107 and 109. A hard mask 111 (e.g., SiN) is provided on the surface of the semiconductor fins.

Figure 1A:
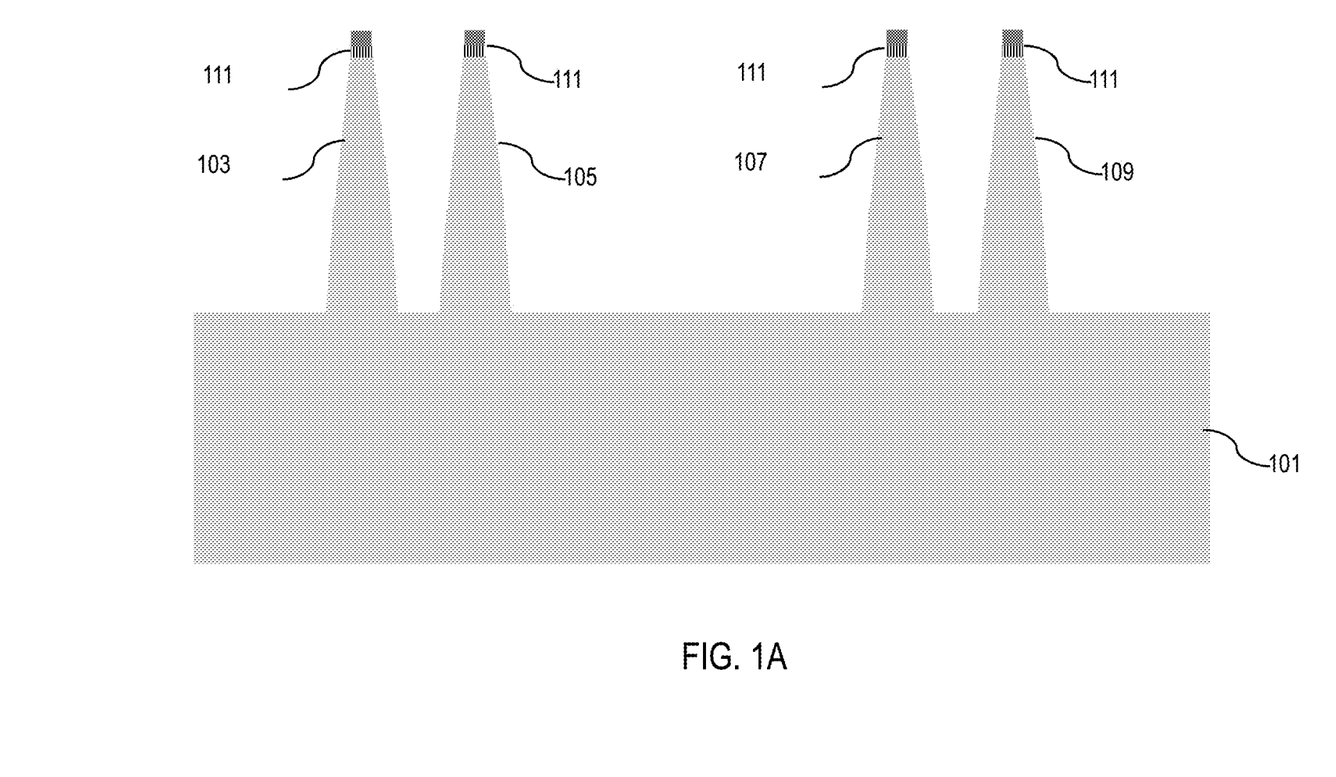
FIGS. 1A through 1J schematically illustrate sequential steps of a method for forming a BSG layer and a PSG layer over a silicon substrate with semiconductor fins and SiN as a capping layer, in accordance with an exemplary embodiment.
Figure 1B:
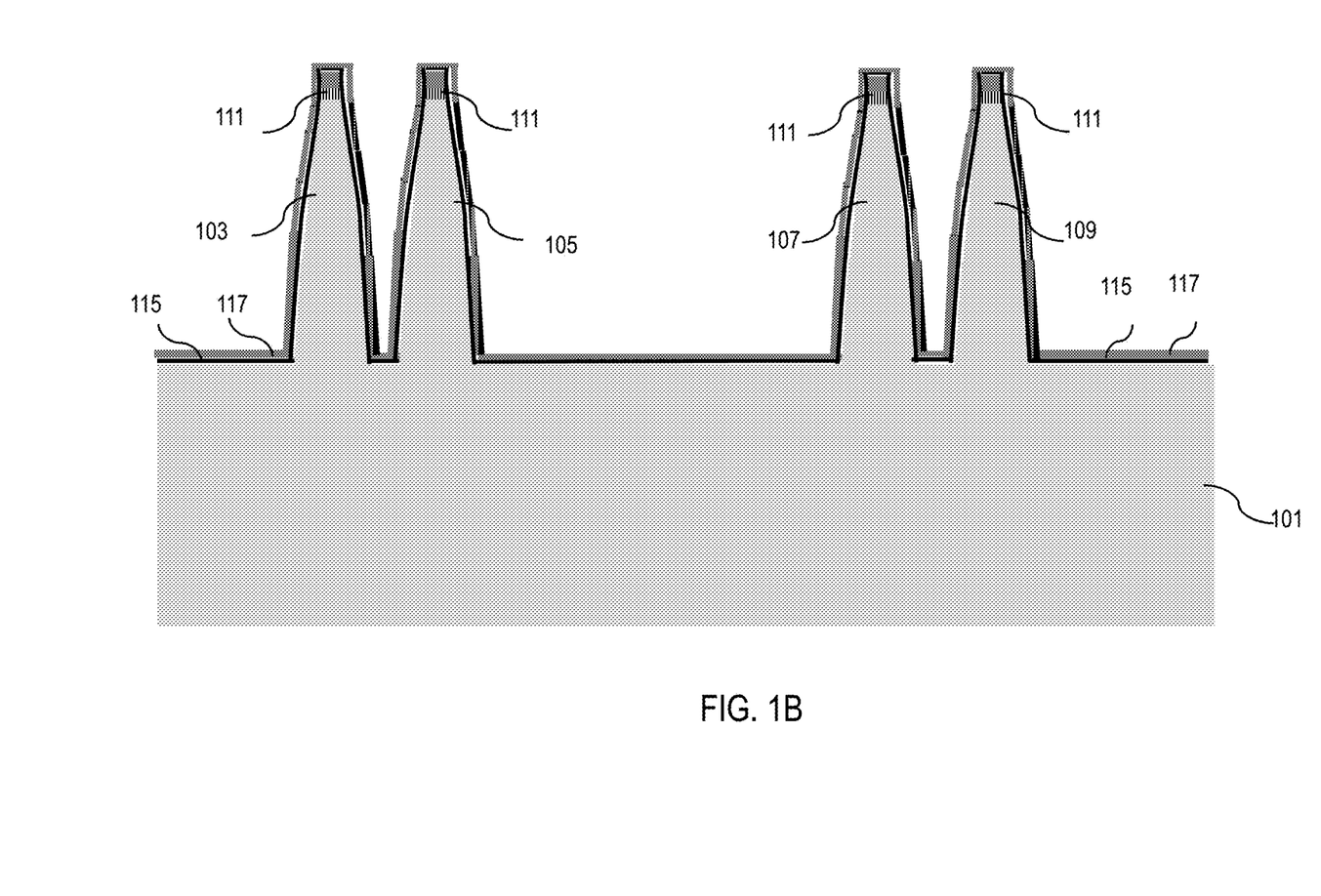

In FIG. 1B, a BSG material 115 is deposited, for example, to a thickness of 2 nm to 5 nm over the substrate 101, the semiconductor fins 103, 105, 107 and 109, the hard mask 111. Then, SiN material 117 is deposited to a thickness of 2 nm to 5 nm over the BSG material 115. The BSG material 115 and the SiN material 117 may, for example, be deposited by atomic layer deposition (ALD).

Figure 1C:
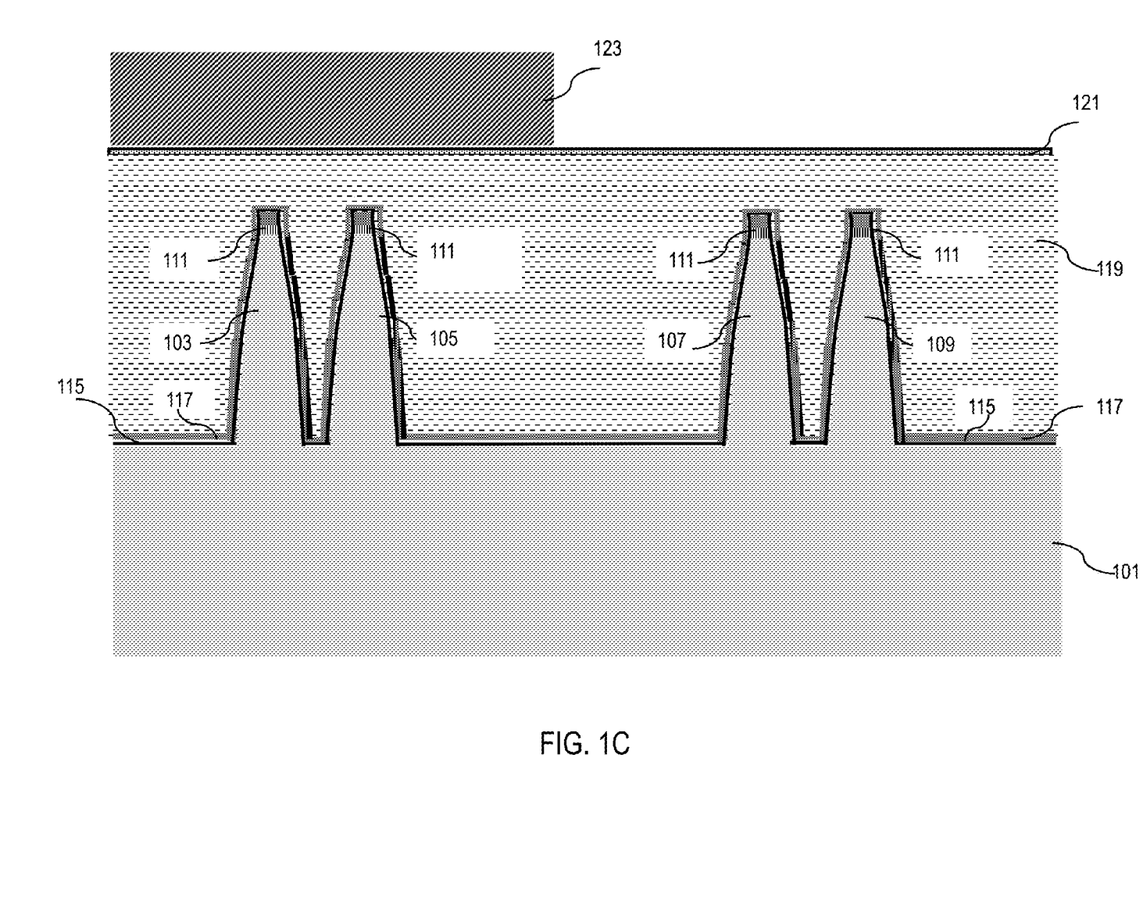

Adverting to FIG. 1C, a SOH material 119 (or alternatively an organic planarization layer (OPL) or spin-on carbon (SOC)) is blanket deposited over the SiN material 117 over the entire substrate. Then, a hard mask 121 (e.g., an oxide or a silicon-containing anti-reflective coating (SiARC) layer, etc.) is formed on an upper surface of the SOH material 119. Subsequently, a bottom anti-reflective coating (BARC) and resist 123 is formed on the hard mask 121 over the first portion of the substrate 101. A BARC is not needed under the resist if the hard mask 121 is a SiARC.

Figure 1D:
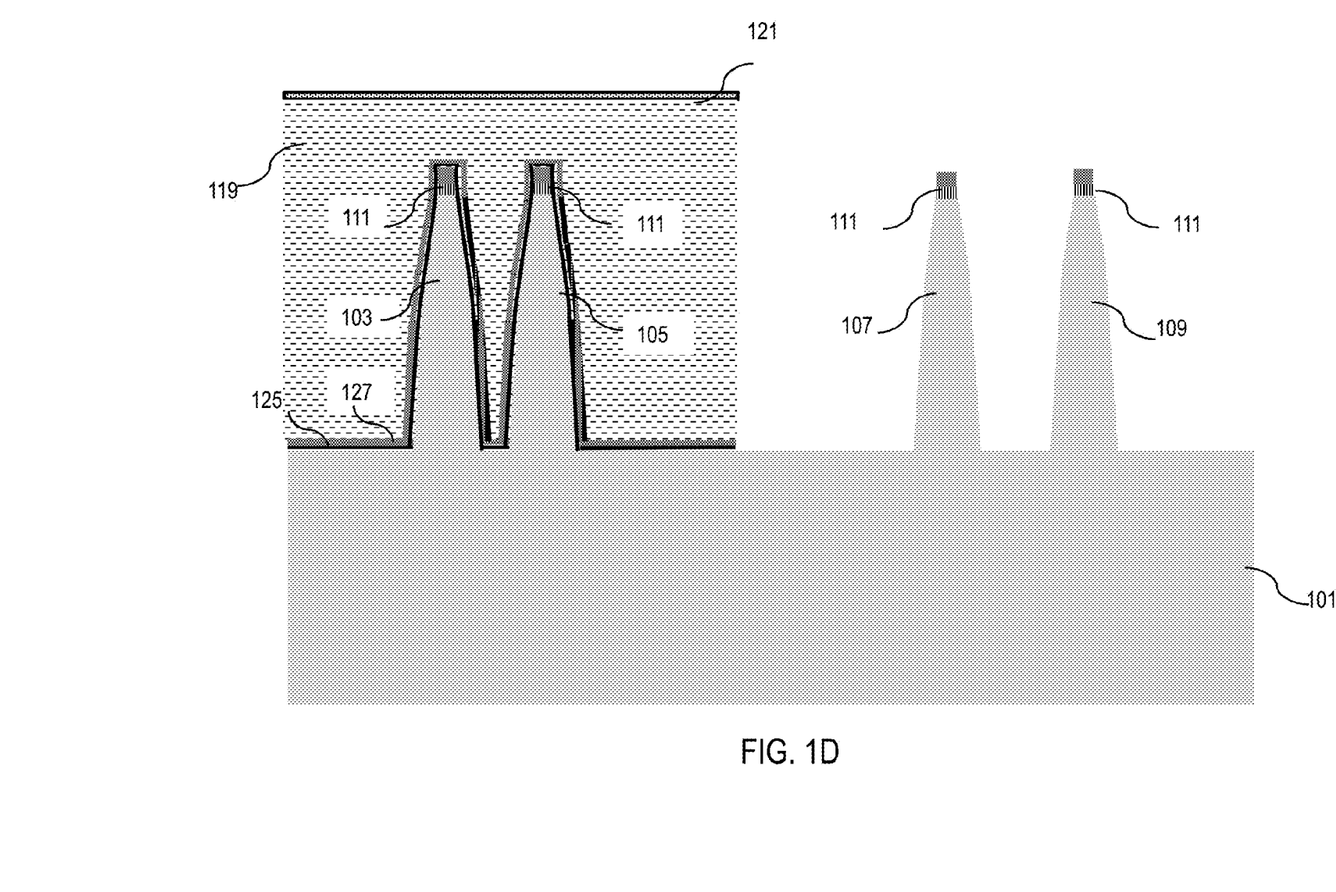

In FIG. 1D, the hard mask 121 and the SOH material 119 located on the second portion of the substrate 101 are removed by isotropic etching (e.g., SiCoNi etch process, etc.). Then, the SiN material 117 and the BSG material 115 are removed from the second portion of the substrate and the semiconductor fins on the second portion of the substrate by etching to form the BSG layer 125 and the first SiN layer 127. Subsequently, the BARC and resist 123 are removed, e.g. by etching. Note that removing the BSG material 115 and the first SiN material 117 also may remove a bit of the upper surface of substrate 101.

Figure 1E:
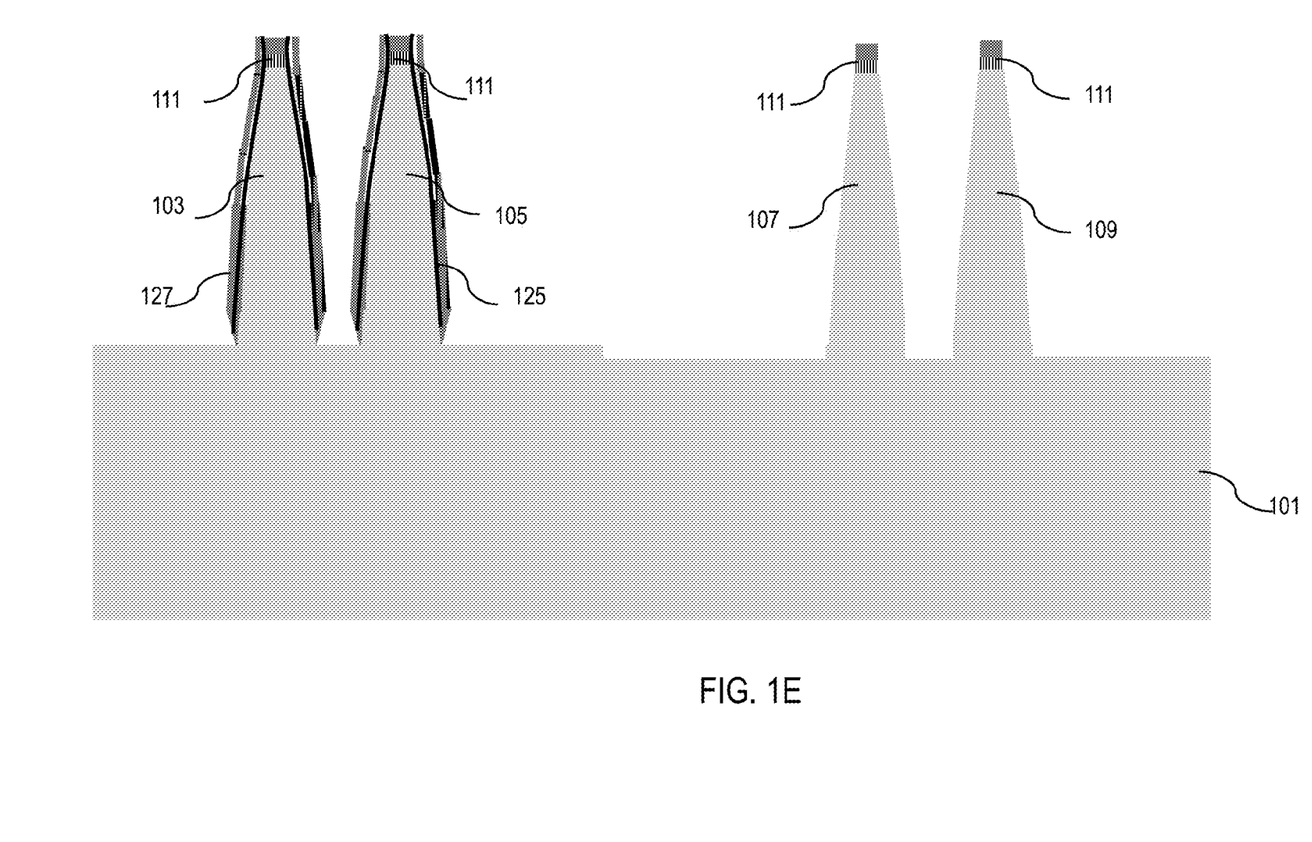

Adverting to FIG. 1E, the remaining hard mask 121 and the SOH material 119 are removed by non-isotropic etching (e.g., RIE). Then, the BSG layer 125 and the first SiN layer 127 are etched from the upper surface of the substrate 101 and from the bottom portion of the semiconductor fins to form an acute angle with the surface of the first portion of the substrate 101.

Figure 1F:
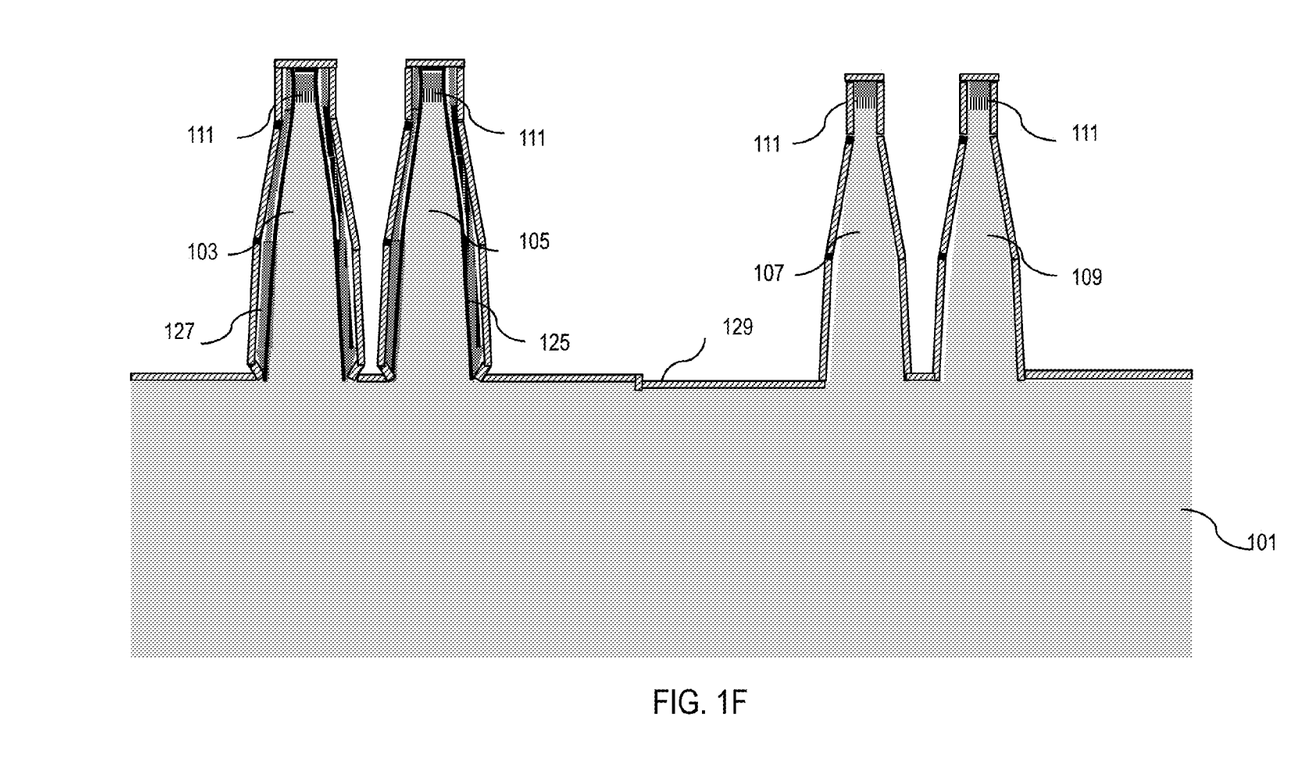

In FIG. 1F, a high quality oxide material is deposited by ALD over the substrate 101, the first SiN layer 127 and the semiconductor fins 107 and 109 on the second portion of the substrate 101. The high quality oxide material may be deposited, for example, by ALD and to a thickness of 1 nm to 5 nm, forming a high quality oxide layer 129.

Figure 1G:
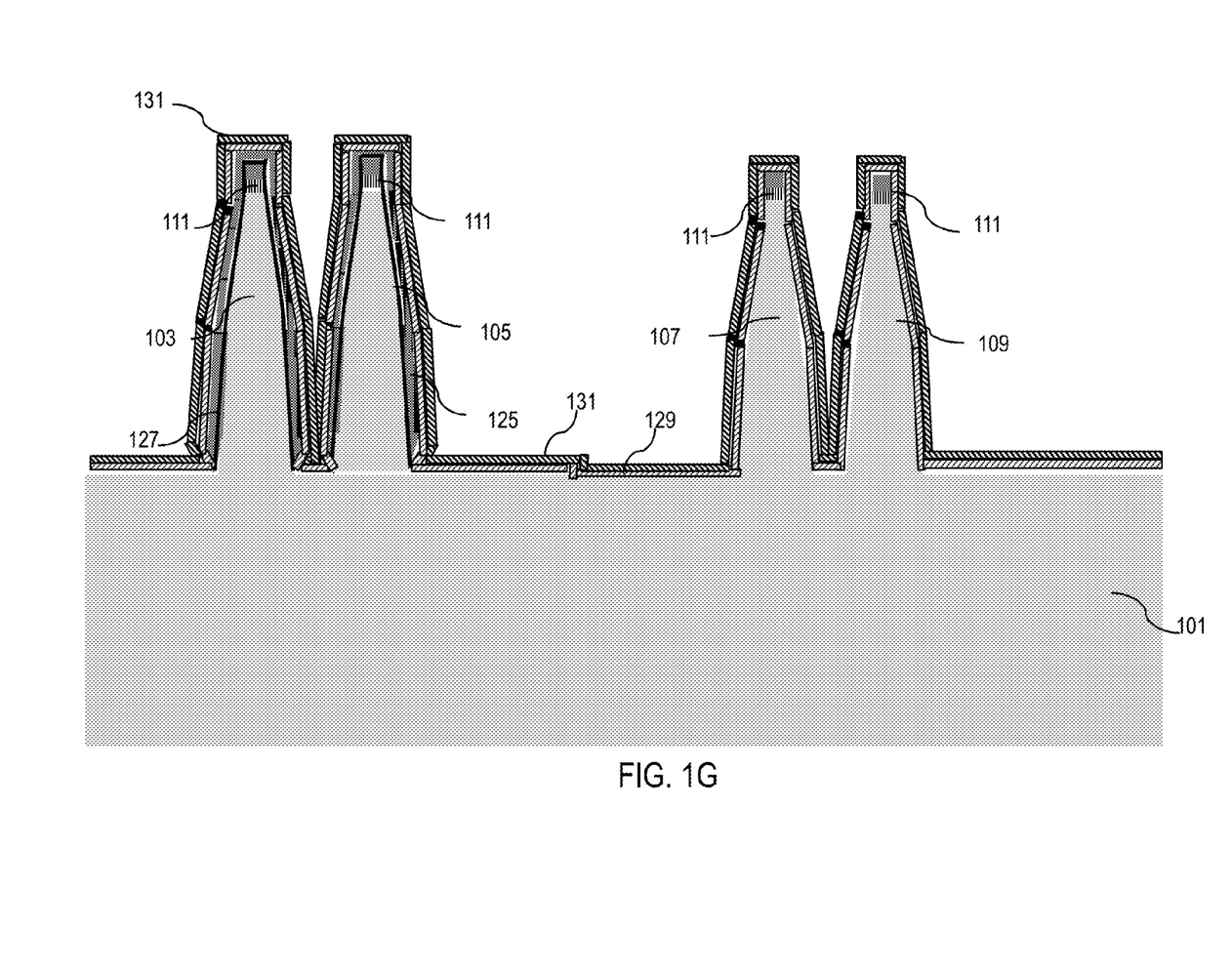
Figure 1H:
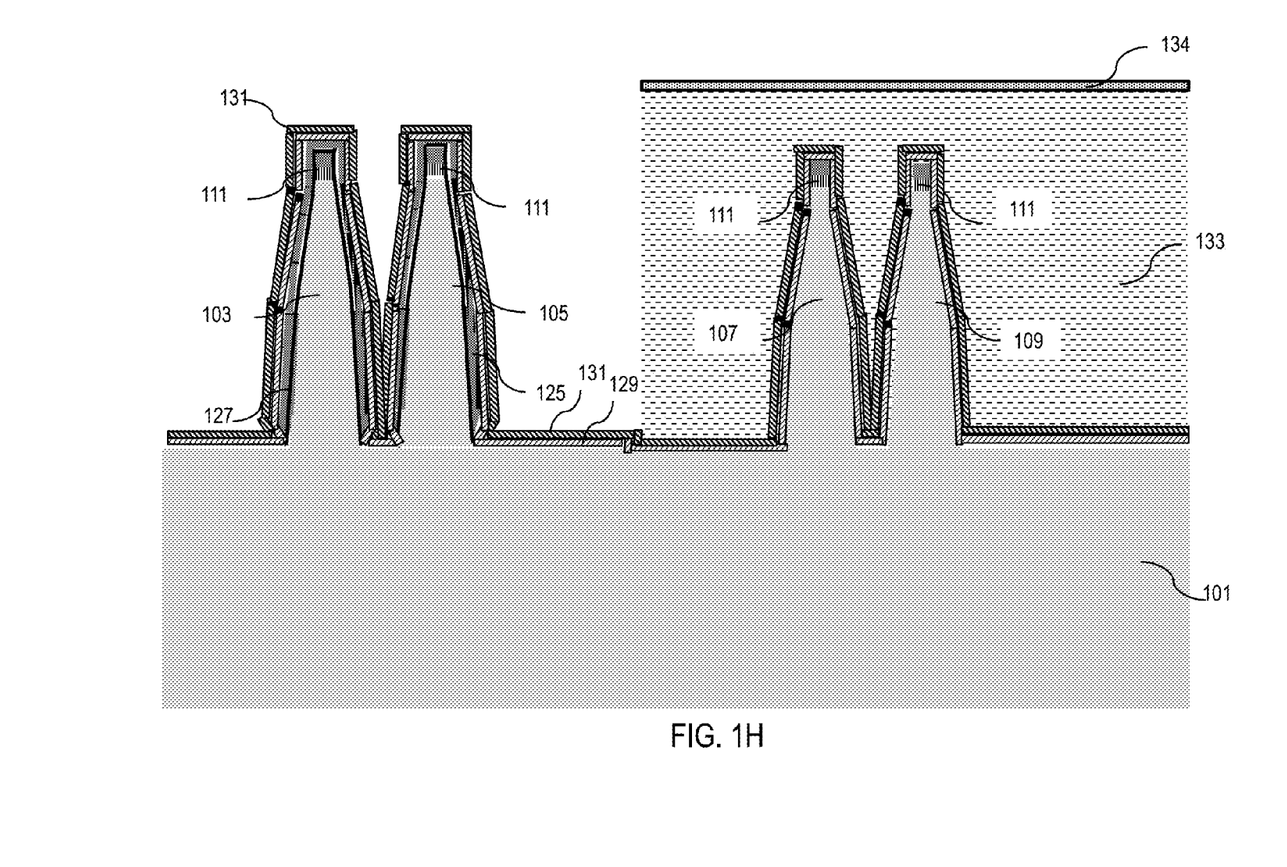
Figure 1I:
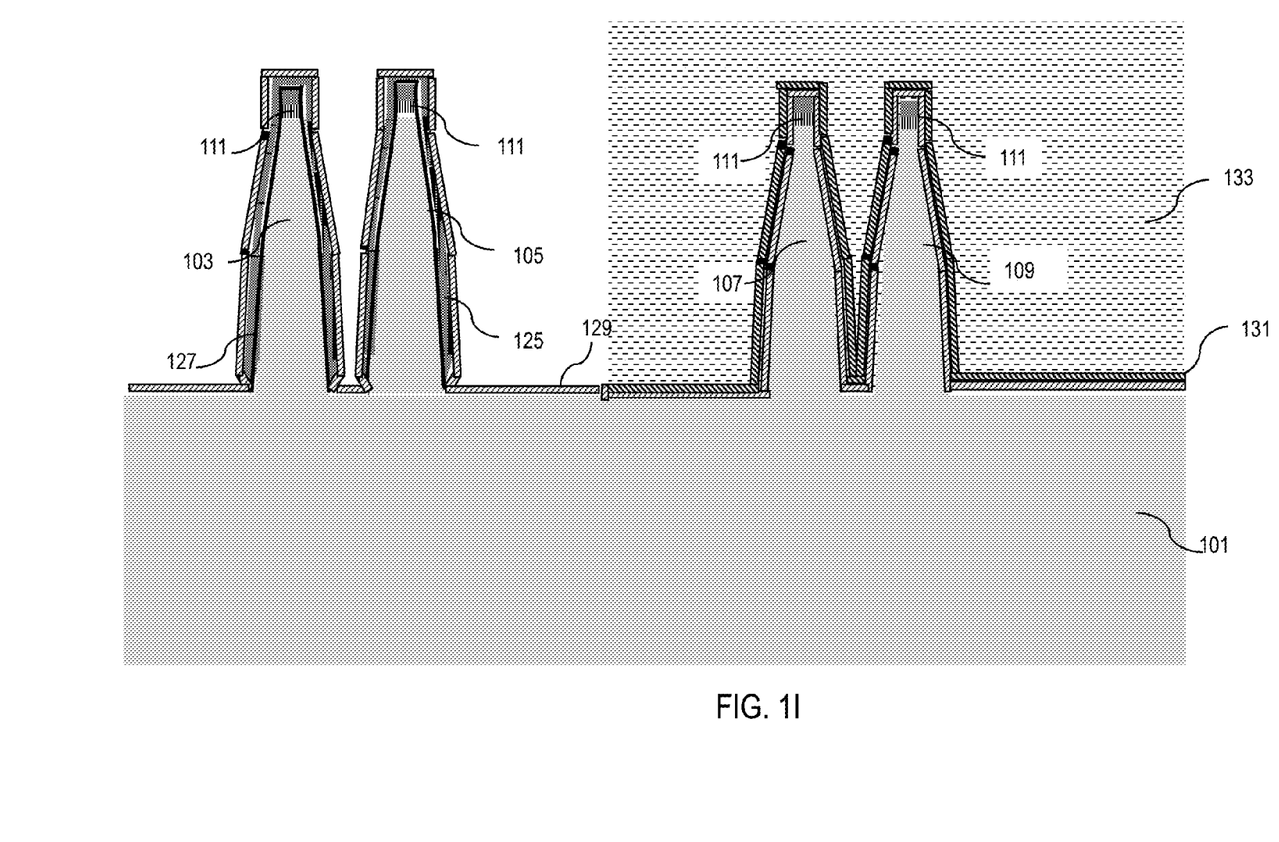

Adverting to FIG. 1G, a PSG material 131 is deposited, e.g. by ALD and to a thickness of 2 nm to 5 nm, over the high quality oxide material 129. Then, in FIG. 1H, a SOH material 133 (or alternatively OPL or SOC) and a hard mask 134 (e.g., oxide or SiARC layer, etc.) are blanket deposited over the PSG material 131 on the second portion of the substrate 101. For example, the SOH material 133 and hard mask 134 may be deposited over the entire substrate. Then the SOH material 133 and hard mask 134 are etched from the first portion, and the BARC and resist are removed. The BARC and resist may be formed over the SOH 133 over the second portion of the substrate 101 and the semiconductor fins 107 and 109 on the second portion of the substrate 101. Subsequently, in FIG. 1I, the PSG material 131 is removed by selective isotropic etching (selective to the high quality oxide layer) from the first portion of the substrate 101 and the semiconductor fins 103 and 105, thereby, forming PSG layer 135. Then, the SOH material 133 and hard mask 134 are removed.

Figure 1J:
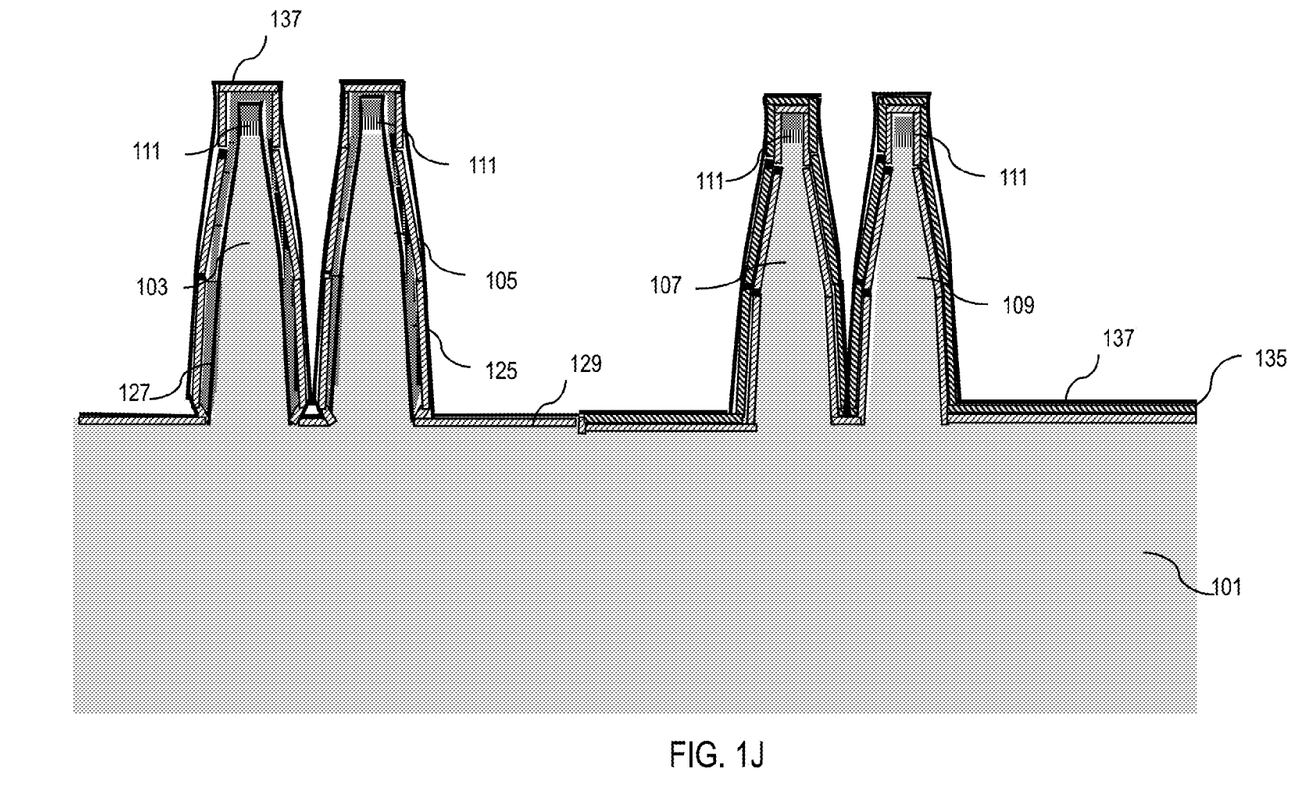

In FIG. 1J, a second layer of SiN material 137 is deposited, e.g. by ALD and to a thickness of 1 nm to 5 nm, over the surface of the high quality oxide layer 129 and the PSG layer 135.

The embodiments of the present disclosure can achieve several technical effects, such as an improved BSG layer, reduced interaction between dopants, and reduced dopants driven into the STI regions. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated finFET semiconductor devices, particularly for the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

The invention claimed is:

1. A method comprising:
providing semiconductor fins on first and second portions of a substrate;
forming a borosilicate glass (BSG) layer on side surfaces of the semiconductor fins on the first portion of the substrate;
forming a first silicon nitride (SiN) layer on the BSG layer;
forming a high quality oxide layer over an upper surface of the substrate, the first SiN layer and side surfaces of the semiconductor fins on the second portion of the substrate;
forming a phospho silicate glass (PSG) layer over the high quality oxide layer on the second portion of the substrate and side surfaces of the semiconductor fins on the second portion of the substrate; and
forming a second SiN layer over the high quality oxide layer and the PSG layer.

2. The method according to claim 1, comprising forming the BSG layer and the first SiN layer by:
depositing a BSG material over the substrate and the semiconductor fins;
depositing a SiN material over the BSG material;
forming a mask over the SiN material over the first portion of the substrate and the semiconductor fins on the first portion of the substrate;
removing the SiN material and the BSG material from the second portion of the substrate and from the semiconductor fins on the second portion of the substrate; and
removing the mask.

3. The method according to claim 2, comprising forming the mask by:
depositing a spin-on-hardmask (SOH) material over the SiN material;
forming a hard mask on an upper surface of the SOH material;
forming a photoresist on the hard mask over the first portion of the substrate;
removing the hard mask, and the SOH material over the second portion of the substrate; and
removing the photoresist.

4. The method according to claim 2, further comprising:
removing the SiN and the BSG materials from the second portion of the substrate and the semiconductor fins on the second portion of the substrate by etching to form the BSG layer and the first SiN layer.

5. The method according to claim 4, further comprising:
etching the SiN layer and the BSG layer from an upper surface of the first portion of the substrate subsequent to removing the mask.

6. The method according to claim 5, further comprising:
etching the SiN layer and the BSG layer on a bottom portion of the semiconductor fins to form an acute angle with the surface of the first portion of the substrate.

7. The method according to claim 1, comprising forming the high quality oxide layer by:
depositing a high quality oxide material over the substrate, the first SiN layer and the semiconductor fins on the second portion of the substrate.

8. The method according to claim 1, comprising forming the PSG layer by:
depositing a PSG material over the high quality oxide layer;
forming a mask with an opening over the first portion of the substrate;
removing the PSG material from the first portion of the substrate and from the semiconductor fins on the first portion of the substrate; and
removing the mask.

9. The method according to claim 8, comprising forming the mask by:
forming a SOH material and a hard mask over the PSG material over the second portion of the substrate and the semiconductor fins on the second portion of the substrate.

10. The method according to claim 9, comprising removing the PSG material by:
etching selective to the high quality oxide layer.

11. A device comprising:
semiconductor fins on first and second portions of a substrate;
a borosilicate glass (BSG) layer on side surfaces of the semiconductor fins on the first portion of the substrate;
a first silicon nitride (SiN) layer on the BSG layer;
a high quality oxide layer over an upper surface of the substrate, the first SiN layer and side surfaces of the semiconductor fins on the second portion of the substrate;
a phospho silicate glass (PSG) layer over the high quality oxide layer on the second portion of the substrate and of the semiconductor fins on the second portion of the substrate; and
a second SiN layer over the high quality oxide layer and the PSG layer.

12. The device according to claim 11, wherein the BSG layer have a thickness of 2 nanometer (nm) to 5 nm.

13. The device according to claim 11, wherein the first SiN layer have a thickness of 2 nm to 5 nm.

14. The device according to claim 11, wherein the high quality oxide layer have a thickness of 1 nm to 5 nm.

15. The device according to claim 11, wherein the PSG layer have a thickness of 2 nm to 5 nm.

16. The device according to claim 11, wherein the second SiN layer have a thickness of 1 nm to 5 nm.

17. A method comprising:
providing semiconductor fins on first and second portions of a substrate;
depositing a BSG material over the substrate and the semiconductor fins;
depositing a SiN material over the BSG material;
forming a first mask over the SiN material over the first portion of the substrate and the semiconductor fins on the first portion of the substrate;
etching the SiN material and the BSG material from the second portion of the substrate and from the semiconductor fins on the second portion of the substrate;
removing the first mask;
etching the SiN material and the BSG layer from an upper surface of the first portion of the substrate;
forming a high quality oxide layer over an upper surface of the substrate, the first SiN material and side surfaces of the semiconductor fins on the second portion of the substrate;
depositing a PSG material over the high quality oxide layer;
forming a second mask with an opening over the first portion of the substrate;
etching the PSG material, selective to the high quality oxide layer, from the first portion of the substrate and from the semiconductor fins on the first portion of the substrate;
removing the second mask; and
depositing a second SiN material over the high quality oxide layer and the PSG layer.

18. The method according to claim 17, comprising forming the first mask by:
depositing a spin-on-hardmask (SOH) material over the SiN material;
forming a hard mask on an upper surface of the SOH material;
forming a photoresist on the hard mask over the first portion of the substrate;
removing the hard mask, and the SOH material over the second portion of the substrate; and
removing the photoresist.

19. The method according to claim 17, further comprising:
etching the SiN material and the BSG layer on a bottom portion of the semiconductor fins to form an acute angle with the surface of the first portion of the substrate.

20. The method according to claim 17, comprising forming the second mask by:
forming a SOH material and a hard mask over the PSG material over the second portion of the substrate and the semiconductor fins on the second portion of the substrate.

* * * * *